(12) United States Patent
McLachlan

(10) Patent No.: US 7,884,747 B2
(45) Date of Patent: Feb. 8, 2011

(54) DIGITAL TO ANALOG CONVERTERS HAVING CIRCUIT ARCHITECTURES TO OVERCOME SWITCH LOSSES

(75) Inventor: Roderick McLachlan, Edinburgh (GB)

(73) Assignee: Analog Devices, Inc., Norwood, MA (US)

( * ) Notice: Subject to any disclaimer, the term of this patent is extended or adjusted under 35 U.S.C. 154(b) by 48 days.

(21) Appl. No.: 12/483,295

(22) Filed: Jun. 12, 2009

(65) Prior Publication Data

US 2010/0315277 A1    Dec. 16, 2010

(51) Int. Cl.
H03M 1/78    (2006.01)
(52) U.S. Cl. .................. 341/154; 341/144
(58) Field of Classification Search ............. 341/144, 341/153, 154
See application file for complete search history.

(56) References Cited

U.S. PATENT DOCUMENTS

| | | | |
|---|---|---|---|
| 4,558,242 A | 12/1985 | Tuthill et al. | |
| 4,800,365 A | 1/1989 | White et al. | |
| 5,075,677 A | 12/1991 | Meaney et al. | |
| 6,157,335 A * | 12/2000 | Suzuki et al. | 341/154 |
| 6,181,263 B1 | 1/2001 | Malik et al. | |
| 6,486,817 B1 * | 11/2002 | Okada et al. | 341/154 |
| 6,529,152 B1 * | 3/2003 | Piasecki et al. | 341/144 |
| 6,567,026 B1 * | 5/2003 | Gorman | 341/154 |
| 6,621,440 B2 * | 9/2003 | Gorman | 341/154 |
| 6,885,213 B2 | 4/2005 | Sunter | |
| 7,102,424 B2 * | 9/2006 | Vorenkamp | 341/154 |
| 7,116,253 B2 | 10/2006 | Norsworthy et al. | |
| 2006/0267639 A1 | 11/2006 | Kobayashi | |
| 2009/0015331 A1 | 1/2009 | Segarra | |

(Continued)

OTHER PUBLICATIONS

Analog Devices, Inc, The Data Conversion Handbook, Dec. 2004, James Bryant and Walt Kester, "Analog-Digital Conversion", Chapter 3: Data Converter Architectures, pp. 3. 1-3.140.

(Continued)

Primary Examiner—Howard Williams
(74) Attorney, Agent, or Firm—Kenyon & Kenyon LLP

(57) ABSTRACT

A digital to analog converter (DAC) includes a pair of operational amplifiers each having a first input coupled to a respective high or low reference voltage. The DAC includes a plurality of switch-controlled cells, each of which includes a resistor and two force/sense switch pairs. Within each cell, all four switches are coupled to the resistor. A first force switch is coupled to an output of a first op amp and an associated sense switch is coupled to an inverting input of the first op amp. A second force switch is coupled to an output of a second op amp and an associated sense switch is coupled to an inverting input of the second op amp. Thus, the force switches provide selectively conductive paths to permit either op amp to drive a given cell. When an op amp drives particular cells, sense switches generate multiple a feedback paths to the driving op amp, which permits the op amp to drive the selected cell resistors at voltages that overcomes any voltage losses induces by associated force switches, and cancels the effect of any variation in the voltage losses induced by different force switches. The switch-controlled cells find application in a variety of DAC architectures, including binary weighted R2R architectures, equally-weighted segmented architectures or hybrid architectures that blend principles of R2R and segmented architectures.

17 Claims, 4 Drawing Sheets

U.S. PATENT DOCUMENTS

2009/0146752 A1    6/2009    O'Day et al.

OTHER PUBLICATIONS

Razavi, B., Principles of Data Conversion System Design, Nov. 1994, Wiley-IEEE Press "Digital to Analog Converter Architectures", Chapter 5, Section 5.2: Current Steering Architectures, pp. 84-95.

International Search Report dated Aug. 5, 2010, in counterpart international application No. PCT/US2010/038346.

Analog Devices Inc., "AD8676: Ultraprecision, 36 V, 2.8 nV/√Hz Dual Rail-to-Rail Output Op Amp", Datasheet, Revision A, Apr. 2008.

Maxim Integrated Products, "MAX541/MAX542: +5V, Serial-Input, Voltage-Output, 16-Bit DACs", Datasheet, 19-1082, Revision 2, Dec. 1999.

Texas Instruments Inc., "DAC8881: 16-Bit, Single-Channel, Low-Noise, Voltage-Output Digital-to-Analog Converter", Datasheet, SBAS422A, revised Sep. 2007.

Texas Instruments Inc., "DAC9881: 18-Bit, Single-Channel, Low-Noise, Voltage-Output Digital-to-Analog Converter", Datasheet, SBAS438A, revised Aug. 2008.

\* cited by examiner

100

200

300

400

DIGITAL TO ANALOG CONVERTERS HAVING CIRCUIT ARCHITECTURES TO OVERCOME SWITCH LOSSES

BACKGROUND

The present invention relates to digital-to-analog converters (DACs) that provide improved linearity, low total switch area, and greater insensitivity to parasitic resistances than conventional voltage-mode DACs. In particular, it relates to such DACs having separate force and sense switches for each independently switched resistor within the DAC.

An integrated voltage-mode digital to analog converter consists of a network of resistors and switches. One node of the network is the output voltage and another two nodes are reference voltages. The analogue output voltage is a voltage that lies somewhere between the two reference voltages as determined by a digital input code. Common designs for high accuracy voltage-mode DACs include binary weighted R2R architectures and segmented architectures that include equally weighted segments or are hybrids between the equally segmented architecture and the R2R architecture. These architectures are discussed in Razavi, *Principles of Data Conversion System Design*, Wiley-IEEE Press (1994). Although these designs vary in architecture, each design provides a plurality of switchable cells that are activated based on the digital code input to the DAC. The activated cells contribute to an analog voltage generated at the DACs output. Each cell's contribution is determined, at least, in part based on the resistance of the cell itself and any coupling resistance that extends between the cell and the output terminal.

In integrated circuits, resistors are often manufactured from a precision thin-film process, while the switches typically are CMOS transistors. It is normal that the resistors are all quite similar in value and size, while the CMOS switches are scaled in some ratio to reduce their contribution to integral non-linearity (INL) error of the DAC. However, the CMOS transistors are still not ideal, for several reasons. In particular, they have some resistance associated with them, which is not linear. Voltage drops across this resistance contribute to the INL error. Moreover, the resistance associated with these CMOS switches varies according to the voltage they operate at and, since there are switches to two different reference voltages, it can reasonably be expected that these will have different resistances at different switch settings. Although some attempts have been made to equalize these switch resistances to minimize this source of INL error, generally some residual error persists due to the accuracy of the method itself. CMOS transistors also have leakage currents to their backgates, particularly at high temperatures, which can provide a further source of INL error.

The problems associated with CMOS transistors become a more significant design concern for higher accuracy, higher voltage DACs (for example, a 16 bit DAC operable at voltages in excess of 5V). The error contribution of CMOS switches is larger than the maximum error permitted. Although larger CMOS transistor switches can withstand higher voltages as compared smaller CMOS switches for the same area, they provide higher resistance which increases the voltage drops across them and the INL contribution. Higher voltage switches also have more leakage.

Conventionally, to provide a voltage-mode DAC that is very accurate, circuit designers use large CMOS switches. Larger switches generally have lower switch resistance, which decreases associated INL error. However, the use of large switches has consequences, such as: requiring larger silicon die area, increasing parasitic capacitance and increasing leakage current at high temperature (another source of INL error), increasing transition currents as new digital codes are loaded into the DAC, and layout/routing problems due to different lengths of interconnect among DAC resistors. Also larger switches require more silicon area, adding cost, and the larger physical size makes miniaturization more difficult Accordingly, there is a need in the art to avoid use of large switches in a voltage-mode DAC.

DETAILED DESCRIPTION

Embodiments of the present invention provide a digital to analog converter that includes a pair of operational amplifiers each having a first input coupled to a respective high or low reference voltage. The DAC includes a plurality of switch-controlled cells, each of which includes a resistor and two force/sense switch pairs. Within each cell, all four switches are coupled to the resistor. A first force switch is coupled to an output of a first op amp and an associated sense switch is coupled to an inverting input of the first op amp. A second force switch is coupled to an output of a second op amp and an associated sense switch is coupled to an inverting input of the second op amp. Thus, the force switches provide selectively conductive paths to permit either op amp to drive a given cell. When an op amp drives a particular cell, a sense switch generates a feedback path to the driving op amp, which permits the op amp to drive the cell at a voltage that overcomes any voltage losses induced by an associated force switch.

The following discussion describes various structures for switch-controlled cells to be used in voltage mode DACs. The principles of the present invention find application in a variety of DAC architectures, including binary weighted R2R architectures, equally-weighted segmented architectures or hybrid architectures that blend principles of R2R and segmented architectures. Throughout this discussion, reference is made to the "resistance" of transistor switches within each circuit to represent the impedance of such switches. To simplify the present discussion, the transistor switches are referenced by labels representing the switches' resistance values. Thus, two switches having common designation, "$R_{ps}$," for example, should be understood to have a common resistance. Two or more switches having relative designations should be understood to have resistances that are related to each other as shown (e.g., "$R_{ps}$," "$2*R_{ps}$," and "$4*R_{ps}$" would represent switches having a base resistance, twice the base resistance and four times the base resistance respectively).

When circuits such as the DACs described herein are manufactured as integrated circuits, it is common to attempt to match the sizes of transistor switches on an integrated circuit die. Transistor size is an indicator of transistor resistance such as the $R_{ps}$ and $R_{ns}$ resistances referenced above. To scale transistor resistances as proposed herein, it may be convenient to provide multiple, commonly-controlled transistors in series with each other to increase overall resistance or to provide multiple, commonly-controlled transistors in parallel with each other to decrease overall resistance. To reduce clutter in the accompanying figures and following text, such series and/or parallel switch connections are not shown.

Figure 1:
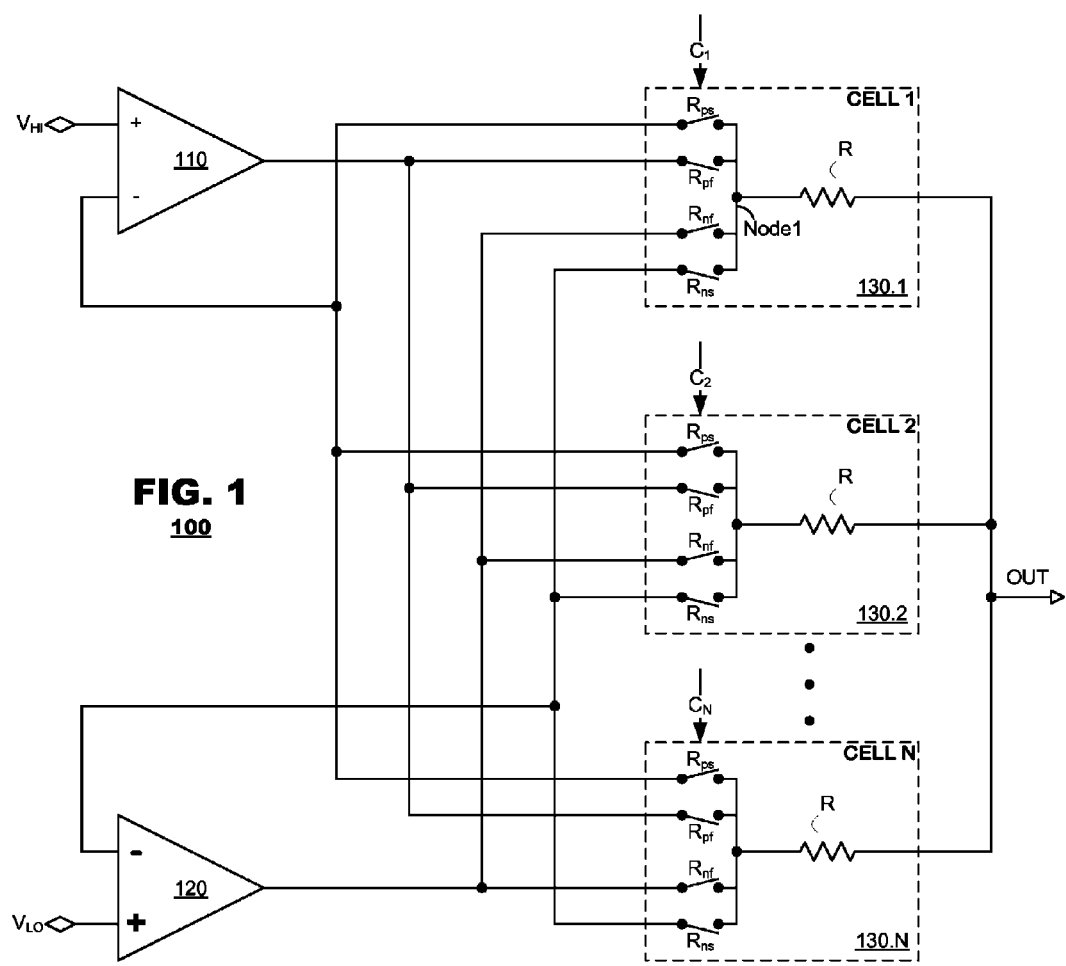
FIGS. 1-4 are circuit diagrams illustrating digital to analog converters according to various embodiments of the present invention.

FIG. 1 is a circuit diagram of a DAC 100 according to an embodiment of the present invention. The DAC 100 may include a pair of operational amplifiers (op amps) 110, 120 and a plurality of switch-controlled cells 130.1-130.N. Reference voltages $V_{HI}$ and $V_{LO}$ may be supplied to the non-inverting input of the respective op amps 110, 120. Each cell 130.1-130.N may include two pairs of switch-controlled transistors and a resistor R. For a DAC of bit width W there would be N=2W cells 130.1-130.N. The DAC 100 may generate an analog voltage having a magnitude somewhere between $V_{HI}$ and $V_{LO}$ as determined by an input control code. Therefore, when activated, each cell 130.1-130.N may contribute incrementally to a voltage at the OUT terminal corresponding to an LSB (least significant bit) step size.

FIG. 1 illustrates the configuration of the cells 130.1-130.N. As indicated, the resistors R of each cell are coupled to the common output terminal OUT. A head end of each resistor R may be connected to each of the cell's four switch transistors, labeled $R_{pf}$, $R_{ps}$, $R_{nf}$ and $R_{ns}$. For labeling purposes, the transistors $R_{pf}$ and $R_{nf}$ are called "force" switches while the transistors $R_{ps}$ and $R_{ns}$ are called "sense" switches. Transistors $R_{pf}$, $R_{ps}$ may be provided as PMOS transistors, which become conductive when the control input applied to the transistor's gate is driven low, and transistors $R_{nf}$, $R_{ns}$ may be provided as NMOS devices, which become conductive when the control input applied to the transistor's gate is driven high. During operation, only one of the transistor pairs will be conductive at a time. Terminals of the force switches $R_{pf}$ and $R_{nf}$ may be coupled to outputs of the first and second op amps 110, 120 respectively. Terminals of the sense switches $R_{ps}$ and $R_{ns}$ may be coupled to inverting inputs of the first and second op amps 110, 120 respectively.

During operation, control signals applied to each cell (say, signal $C_1$ applied cell 130.1) cause switches to open or close. Thus, one switch pair ($R_{pf}$, $R_{ps}$) or the other ($R_{ns}$, $R_{nf}$) will close in response to the control signal $C_1$ and the other switch pair will open. Closing the switch pair (say, $R_{pf}$ and $R_{ps}$) causes an associated op amp 110 to be coupled to the cell's resistor R through the conductive force switch ($R_{pf}$). Thus, the connected amplifier (op amp 110) contributes to the DAC's output voltage via the cell 130.1. Current from the connected amplifier 110 or 120 can flow through the connected force switch, through the associated cell resistor and to the OUT terminal.

The control signal also closes an associated sense switch $R_{ps}$ or $R_{ns}$. The closed sense switch connects the head end of the resistor R to the input terminal of the associated op amp 110 or 120 which generates a feedback loop to the op amps 110, 120.

Consider an example where the PMOS switches $R_{pf}$, $R_{ps}$ of only a single cell 130.1 are closed in response to a control signal $C_1$ and all other cells 130.2-130.N are controlled to leave their PMOS switches $R_{pf}$, $R_{ps}$ open. In such a case, an output of op amp 110 drives the output terminal OUT through the force switch $R_{pf}$ and the associated resistor R of the single cell 130.1. Although sense switch $R_{ps}$ is closed, no current flows through the sense switch because the only electrical path through the switch extends to the input terminal of op amp 110, which is extremely high impedance. Thus, there is no voltage loss across the sense switch $R_{ps}$. The voltage presented at the inverting input terminal is the voltage at the head end of resistor R. To balance the voltages present at its input terminals, the op amp 110 may generate an output voltage at a level sufficient to bring the voltage at the head end of the resistor R to $V_{HI}$. Thus, the voltage at the head end of the resistor R is maintained at $V_{HI}$ notwithstanding an undetermined voltage loss across the force switch $R_{pf}$.

Consider an example where the PMOS switches $R_{pf}$, $R_{ps}$ of several cells 130.1-130.X are closed in response to respective control signals (X represents the number of cells driven high in this example). In such a case, an output of op amp 110 drives the output terminal OUT through the force switches $R_{pf}$ and the associated resistors R of the X cells. In this case, although no current can enter the inverting input of the op amp 110, current can flow among the sense switches $R_{ps}$ of the X cells. Thus, voltage losses can arise across the sense switches $R_{ps}$ of these cells. These voltage losses can vary among the various cells, particularly if the resistances of the force switches $R_{pf}$ are not well matched.

In such a case, the voltage established at the inverting input of the first op amp 110 will represent an average of the voltages present at the head end of the resistors R of the X activated cells and the resistances of the sense switches $R_{ps}$. To balance the voltages present at its input terminals, the op amp 110 may generate an output voltage at a level sufficient to bring this average to $V_{HI}$. When distributed to the activated cells 130.1-130.X, this configuration has an equivalent effect to establishing voltages at the head end of each resistor R at $V_{HI}$. Although voltage drops across the force switches $R_{pf}$ and sense switches $R_{ps}$ may vary among individual cells, the feedback configuration essentially cancels out these variations. This configuration, therefore, improves the accuracy of high resolution DACs.

Similar effects may occur for those cells driven low by the control signals $C_1$-$C_N$. When only a single cell 130.N is driven to close the NMOS switches $R_{ns}$, $R_{nf}$, the output of the second op amp 120 drives the output terminal OUT via the associated force switch $R_{nf}$ and resistor R of the cell 130.N. The associated sense switch $R_{ns}$ also will close, establishing an electrical path to the inverting terminal of the second op amp 120, which does not accept significant input current. Thus, negligible voltage loss will occur across the sense switch $R_{ns}$. The op amp 120 will generate an output to overcome any voltage loss across the force switch, establishing the $V_{LO}$ voltage at the head end of the associated resistor R. If multiple cells are driven low, a voltage will be established at the inverting input representing an average of the voltages generated at the head ends of the connected cell resistors R. To balance the voltages at its inputs, the second op amp 120 may generate an output voltage sufficient to overcome any voltage loss across the cells' force switches $R_{nf}$ and cause the average to match the $V_{LO}$ voltage. Although voltage drops across the force switches $R_{nf}$ and sense switches $R_{ns}$ may vary among individual cells, the feedback configuration essentially cancels out these variations. Again, this configuration improves the accuracy of high resolution DACs.

Figure 2:
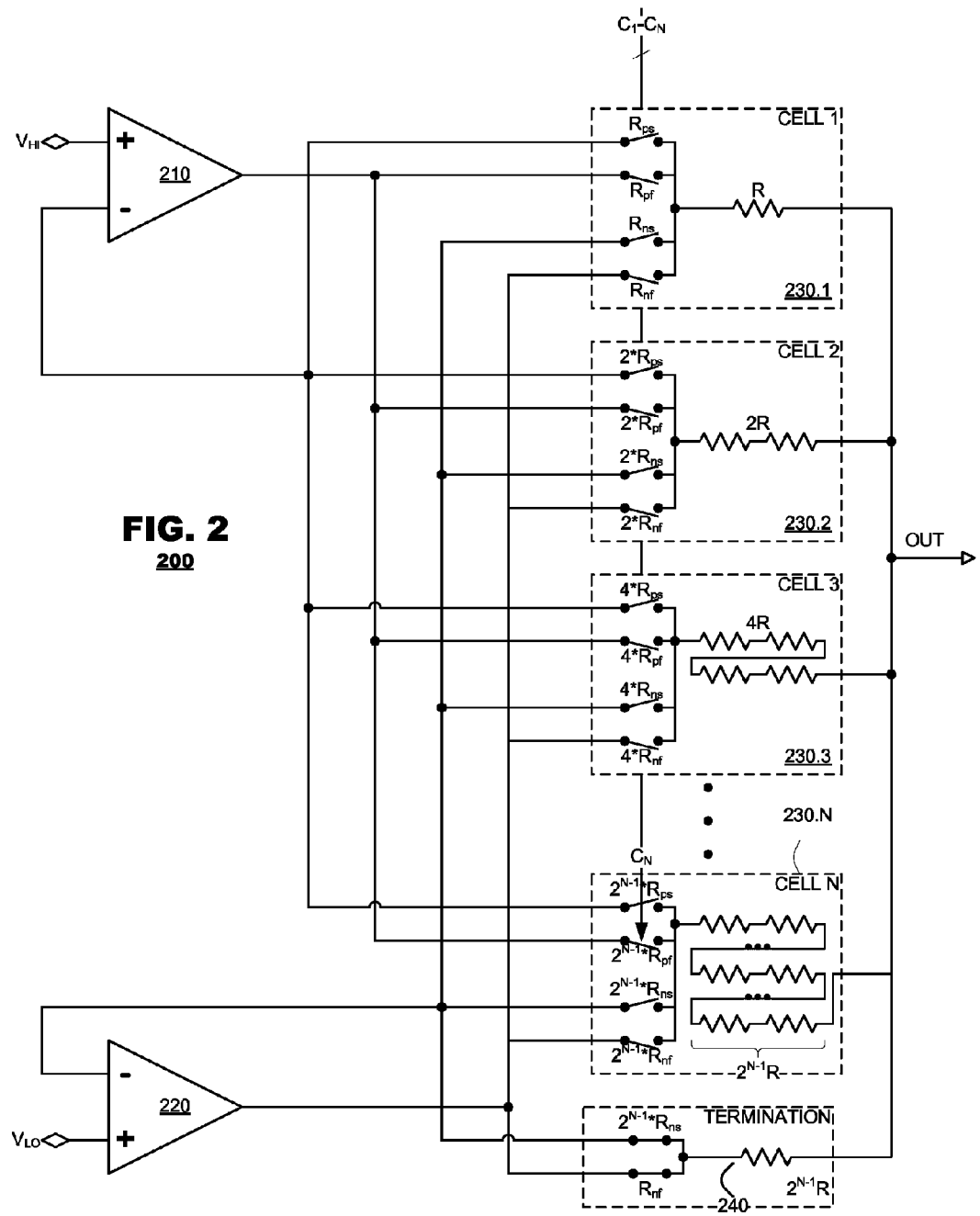

FIG. 2 is a circuit diagram of a binary weighted DAC 200 according to an embodiment of the present invention. The DAC 200 may include a pair of op amps 210, 220 and a plurality of binary weighted cells 230.1-230.N. Reference voltages $V_{HI}$ and $V_{LO}$ may be supplied to the non-inverting input of the respective op amps 210, 220. Each cell may include two pairs of switch controlled transistors and a resistor, both of which are weighted. In the configuration of FIG. 2, a DAC of bit width W may have N=W cells. The DAC 200 may generate an analog voltage having a magnitude somewhere between $V_{HI}$ and $V_{LO}$, as determined by an input control code. Therefore, when activated, each cell may contribute incrementally to a voltage at the OUT terminal in a manner inversely proportional to its binary weighting.

FIG. 2 illustrates the configuration of the cells 230.1-230.N. As illustrated, the transistors and resistors of each cell 230.1-230.N are labeled in accordance with their respective resistances. With respect to the resistors, a first cell 230.1 has a resistor provided at a base resistance R and resistors of other cells 230.2-230.N escalate according to a binary exponential: 2*R, 4*R, 8*R, etc. and concluding with a resistance $2^{hu\ N-1}*R$ of a final cell 230.N. The DAC also may include a termination resistor 240 that has a resistance to equal the weight of the termination cell 230.N corresponding to the least significant bit. In FIG. 2, the termination resistor is shown as coupled to its own NMOS force and sense switches which are permanently switched to the second op amp.

The resistors of each cell 230.1-230.N may be coupled to the common output terminal OUT. Each cell 230.1-230.N may include a first pair of PMOS transistors and a second pair of NMOS transistors also having resistances that escalate according to the binary exponential. PMOS force switches $R_{pf}, 2*R_{pf}, 2^{N-1}*R_{pf}$ from each cell 230.1-230.N may be connected to an output of the first op amp 210 and NMOS force switches $R_{nf}, 2*R_{nf}, 2^{N-1}*R_{nf}$ may of each cell 230.1-230.N may be connected to an output of the second op amp 220. PMOS sense switches $R_{ps}, 2*R_{ps}, \ldots, 2^{N-1}*R_{ps}$ from each cell 230.1-230.N may be connected to an inverting input of the first op amp 210 and NMOS sense switches $R_{ns}, 2*R_{ns}, \ldots, 2^{N-1}*R_{ns}$ of each cell 230.1-230.N may be connected to an inverting input of the second op amp 220. The force and sense switches of each cell 230.1-230.N may be controlled by a respective control signal $C_1$-$C_N$.

During operation, control signals applied to each cell (say, signal $C_1$ applied cell 230.1) cause switches to open or close. Thus, one switch pair ($R_{pf}, R_{ps}$) or the other ($R_{ns}, R_{nf}$) will close in response to the control signal $C_1$ and the other switch pair will open. Closing the switch pair (say, $R_{pf}$ and $R_{ps}$) causes an associated op amp 210 to be coupled to the cell's resistor R through the conductive force switch ($R_{pf}$). Thus, the connected amplifier (op amp 210) contributes to the DAC's output voltage via the cell 230.1. Each cell's contribution to the DAC's output voltage is weighted inversely according to the cell's overall resistance. In the configuration of FIG. 2, each cell's resistance arises from the cell's resistor (e.g., R, 2*R, etc.) and whichever one the two force switches has been closed by the control signal C (e.g., $R_{ps}$ or $R_{ns}$, $2*R_{ps}$ or $2*R_{ns}$, etc.). Current from the connected amplifier 210 or 220 can flow through the connected force switch, through the associated cell resistor and to the OUT terminal.

The control signal $C_1$ also closes an associated sense switch $R_{ps}$ or $R_{ns}$. The closed sense switch connects the head ends of the resistor R to the input terminal of the associated op amp 210 or 220 which generates a feedback loop to the op amps 210, 220.

Operation of the binary weighted DAC 200 resembles operation of the non-weighted DAC 100 of FIG. 1. In this embodiment, however, activated cells 230.1-230.N provide weighted contributions to the voltage at the output terminal OUT. For those cells for which the PMOS force switches are closed (for example, $R_{pf}$ and $4*R_{pf}$), the associated sense switches and $4*R_{ps}$ also close, which couple the nodes at the head ends of the cell resistors R and 4*R to the inverting input of op amp 210. The voltage at the inverting input of the op amp 210 is a weighted average of the voltages present at the head end of the associated resistors R and 4*R. The op amp 210 generates an output voltage necessary to balance the voltages at its two input terminals (bring them to $V_{HI}$). The weighting that produces the average, in this example a 4:1 weighting, is such that the op amp 210 generates an output voltage that overcomes the voltage losses that are induced by $R_{pf}$ and $4*R_{pf}$. Although voltage drops across the force switches $R_{pf}, 4*R_{pf}$ and sense switches $R_{ps}, 4*R_{ps}$ may vary among individual cells, the feedback configuration essentially cancels out these variations. As in the prior embodiment, this configuration improves the accuracy of the DAC 200.

Similarly, for those cells for which the NMOS force switches are closed (for example, $2*R_{nf}$ and $2^{N-1}*R_{nf}$), the associated sense switches $2*R_{ns}$ and $2^{N-1}*R_{ns}$ also close, which couple the nodes at the head ends of the cell resistors $2*R$ and $2^{N-1}*R$ to the inverting input of op amp 220. The voltage at the inverting input of the op amp 220 is a weighted average of the voltages present at the head ends of the associated resistors $2*R$, $2^{N-1}*R$. The op amp 220 may generate an output voltage necessary to balance the voltages at its two input terminals (bring them to $V_{LO}$). Thus, the op amp 220 generates an output voltage that overcomes the voltage losses that are induced by $2*R_{nf}$ and $2^{N-1}*R_{nf}$. Again, this configuration improves the accuracy of the DAC 200.

Figure 3:
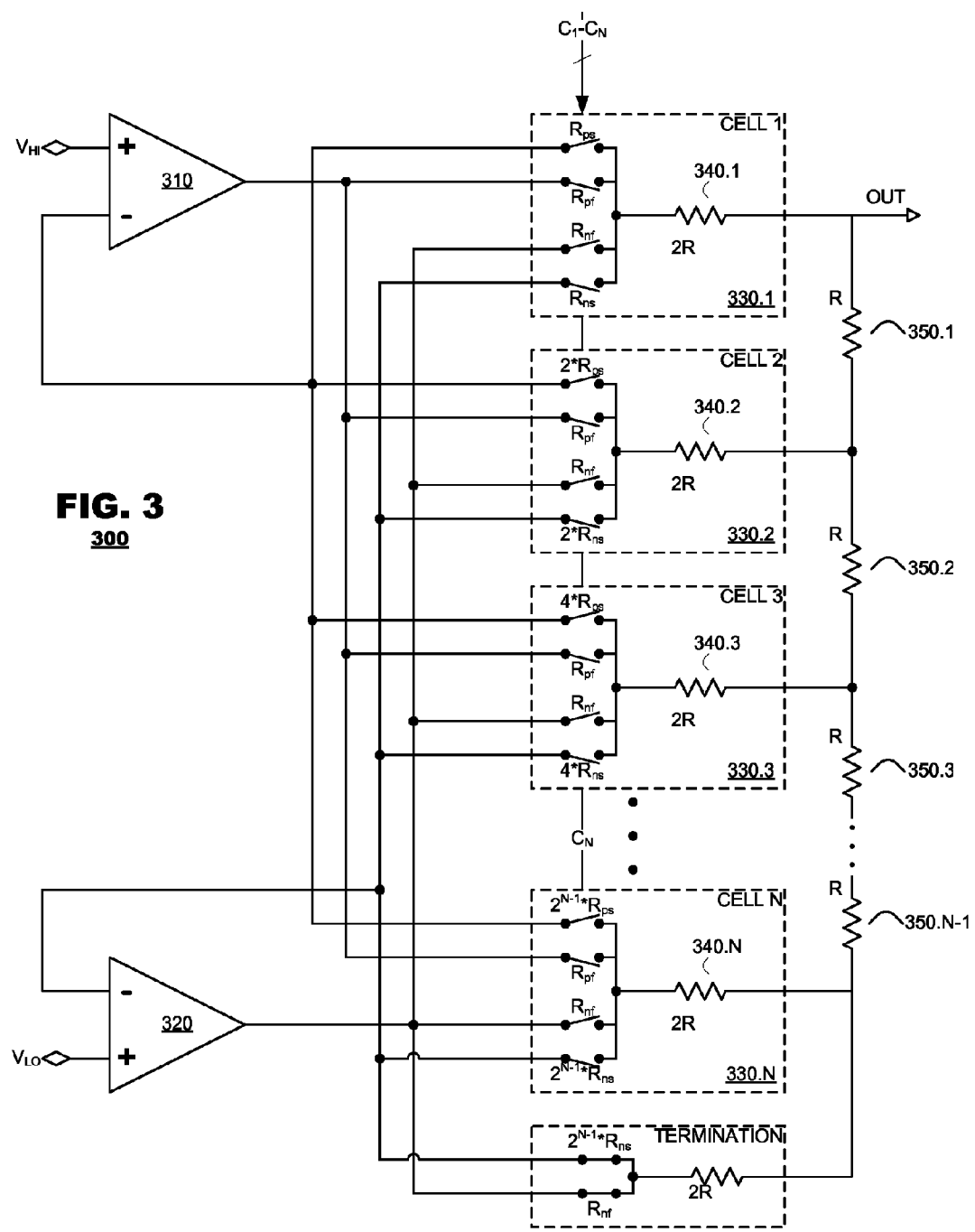

FIG. 3 is a circuit diagram of another binary weighted DAC 300 according to an embodiment of the present invention. The DAC 300 may include a pair of op amps 310, 320 and a plurality of cells 330.1-330.N. A DAC 300 of bit width W may have N=W cells. Reference voltages $V_{HI}$ and $V_{LO}$ may be supplied to the non-inverting inputs of the respective op amps 310, 320. Each cell 330.1-330.N may include two pairs of switch controlled transistors and a resistor 340.1-340.N. The cells 330.1-330.N may be coupled to the output terminal OUT via coupling resistors 350.1 to 350.N−1. A first cell 330.1 may be connected directly to the output terminal but cell N−1 is connected to the OUT terminal via N−1 resistors. In this architecture, the cell resistors 340.1-340.N will have twice the resistance of the coupling resistors 350.1 to 350.N−1. FIG. 3 also illustrates a termination resistor that is common to the binary weighted DAC architecture of this type. The DAC 300 may generate an analog voltage having a magnitude somewhere between $V_{HI}$ and $V_{LO}$, as determined by an input control code. Therefore, when activated, each cell 330.1-330.N may contribute incrementally to a voltage at the OUT terminal in a manner inversely proportional to its binary weighting.

FIG. 3 illustrates the configuration of the cells 330.1-330.N. As illustrated, the transistors of each cell 330.1-330.N are labeled in accordance with their respective resistances. In this configuration, the force switches $R_{pf}, R_{nf}$ of all cells 330.1-330.N may have common resistances. Resistances of the sense switches, however, may be provided in a binary weighted manner as shown. The PMOS force switches $R_{pf}$ may be connected to an output of the first op amp 310 and NMOS force switches $R_{nf}$ may be connected to an output of the second op amp 320. PMOS sense switches $R_{pf}, 2*R_{pf}, \ldots, 2^{N-1}*R_{pf}$ from each cell 330.1-330.N may be connected to an inverting input of the first op amp 310 and NMOS sense switches $R_{nf}, 2*R_{nf}, \ldots, 2^{N-1}*R_{nf}$ of each cell 330.1-330.N may be connected to an inverting input of the second op amp 320. The force and sense switches of each cell 330.1-330.N may be controlled by respective control signals $C_1$-$C_N$.

During operation, control signals applied to each cell (say, signal $C_1$ applied cell 330.1) cause switches to open or close. Thus, one switch pair ($R_{pf}, R_{ps}$) or the other ($R_{ns}, R_{nf}$) will close in response to the control signal $C_1$ and the other switch pair will open. Closing the switch pair (say, $R_{pf}$ and $R_{ps}$) causes an associated op amp 310 to be coupled to the cell's resistor 340.1 through the conductive force switch ($R_{pf}$). Thus, the connected op amp 310 contributes to the DAC's output voltage via the cell 330.1. In the configuration of FIG. 3, the cell's impedance arises from the cell's resistor 340.1 and whichever one the two force switches has been closed by the control signal $C_1$ ($R_{pf}$ in this example). Current from the connected amplifier 310 can flow through the connected force switch $R_{pf}$, through the associated cell resistor 340.1 and to the output terminal OUT. For other cells 330.2-330.N, current would flow through the respective cells and further through any coupling resistors 350.1 to 350.N−1 that connect the cell to the OUT terminal.

The control signal $C_1$ also closes an associated sense switch $R_{ps}$ or $R_{ns}$. The closed sense switch connects the head end of the resistor 340.1 to the input terminal of the associated op amp 310 or 320 which generates a feedback loop to the op amps 310, 320.

Operation of the binary weighted DAC 300 resembles operation of the weighted DAC 200 of FIG. 2. Activated cells 330.1-330.N provide weighted contributions to the voltage at the output terminal OUT. For those cells for which the PMOS force switch is closed (for example, cells 1 and 3), the associated sense switches also close, which couple the nodes at the head ends of the cell resistors 340.1, 340.3 to the inverting input of op amp 310. The voltage at the inverting input of the op amp 310 is a weighted average of the voltages present at the head ends of the associated resistors 340.1, 340.3. The weighting corresponds to the effects that the voltage losses of the different force switches may have on the DAC's overall linearity. The op amp 310 generates an output voltage necessary to balance the voltages at its two input terminals (bring them to $V_{HI}$). Thus, the op amp 310 generates an output voltage that overcomes the voltage losses that are induced by the force switches $R_{pf}$ of the respective cells. As in the prior embodiment, this configuration improves the accuracy of the DAC 300.

Similarly, for those cells for which the NMOS force switch is closed (for example, cells 330.2 and 330.N), the associated sense switches also close, which couple the nodes at the head ends of the cell resistors 340.2, 340.N to the inverting input of op amp 320. The voltage at the inverting input of the op amp 320 is a weighted average of the voltages present at the head ends of the associated resistors 340.2, 340.N. The op amp 320 may generate an output voltage necessary to balance the voltages at its two input terminals (bring them to $V_{LO}$). Thus, the op amp 320 generates an output voltage that overcomes the voltage losses that are induced by force switches from the corresponding cells 330.2, 330.N. Again, this configuration improves the accuracy of the DAC 300.

Figure 4:
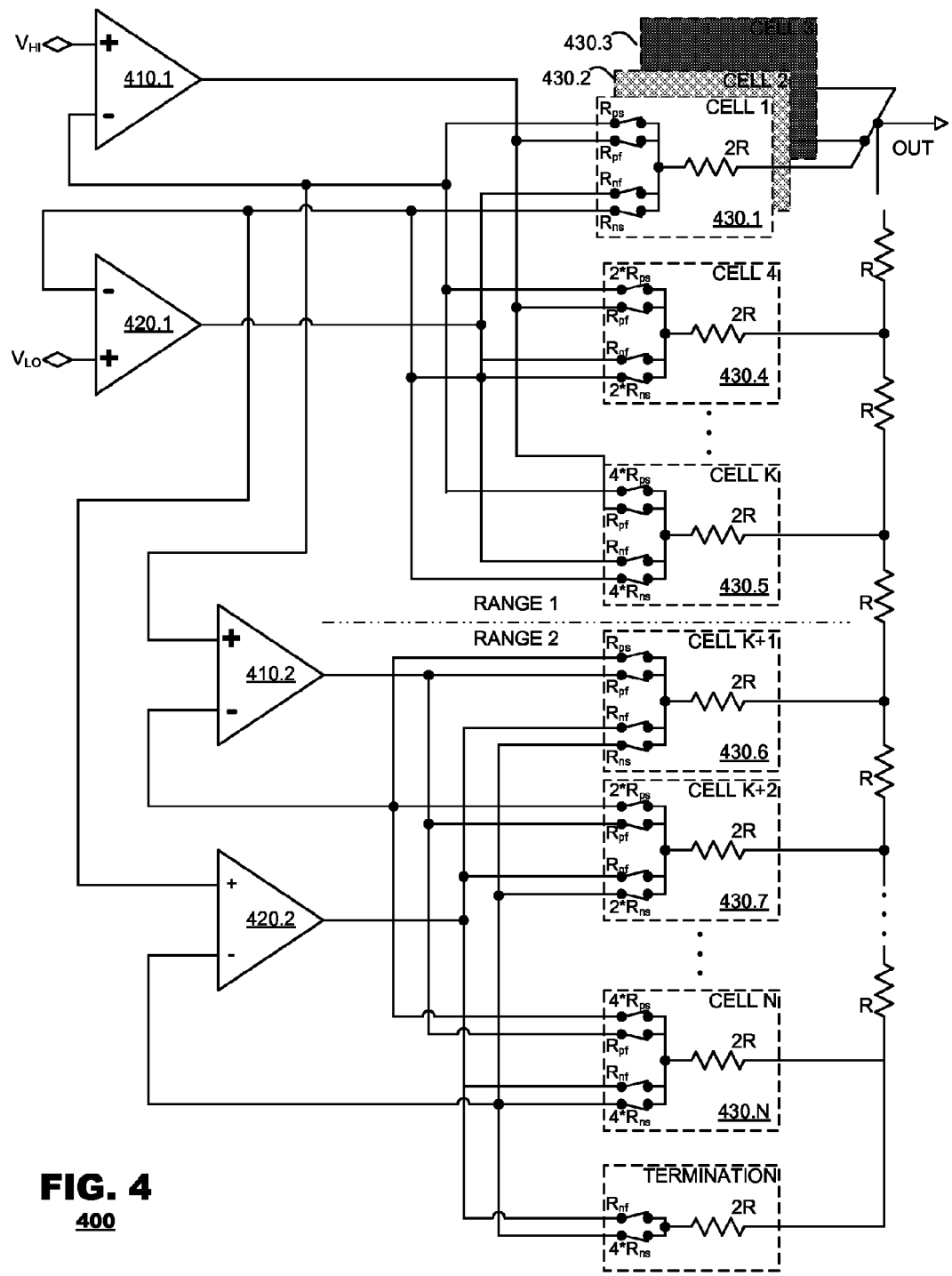

FIG. 4 is a circuit diagram of another DAC 400 according to an embodiment of the present invention. The DAC 400 is organized into a plurality of sub-circuits, called "ranges" herein, each of which includes a respective pair of op amps 410.1/420.1, 410.2/420.2 and a plurality of cells. Although two ranges are illustrated in FIG. 4, the DAC 400 may include additional ranges as may be desired. The op amps 410.1, 420.1 within a first range may be coupled respectively to the $V_{HI}$ and $V_{LO}$ voltages at the op amps' non-inverting inputs. Non-inverting inputs of the op amps of other ranges (e.g., op amps 410.2, 420.2) may be coupled to the inverting inputs of the first pair of op amps 410.1, 420.1. FIG. 4 also illustrates a termination resistor in the terminal range.

During operation, each op amp 410.1, 420.2 will generate output voltages to balance the input voltages present at its inputs. Thus, op amp 410.1 will generate a voltage to bring the voltage at its non-inverting input to $V_{HI}$ and op amp 410.2 may use this voltage as its reference voltage. Similarly, op amp 420.1 will generate a voltage to bring the voltage at its non-inverting input to $V_{LO}$ and op amp 420.2 may use this voltage as its reference voltage. This configuration extends $V_{HI}$ and $V_{LO}$ to all op amps in the DAC 400.

Alternatively, the non-inverting inputs of op amps 420.1, 420.2 could be connected directly to $V_{HI}$ and $V_{LO}$ respectively (not shown). Connecting the non-inverting inputs of all the op amps 410.1, 420.2, 410.1, 420.2 may introduce non-linearities, however, due to effects of op amp offsets, which should not be incurred in the embodiment illustrated in FIG. 4.

Each cell 430.1-430.N may include two pairs of force/sense switch pairs of complementary type (e.g., PMOS and NMOS) and an associated resistor 2R. The PMOS force switches in each range may be coupled to the output of an associated first op amp and the associated PMOS sense switches may be coupled to the inverting input terminal of the same op amp. For example, the PMOS force switches of cells 430.1-430.5 are shown as coupled to the output of op amp 410.1 and the PMOS force switches of cells 430.6-430.N are shown as coupled to the output of op amp 410.2. The sense switches of each cell may be coupled to the inverting inputs of the op amps 410.1, 410.2 to which their associated force switch is connected. Similarly, the NMOS force switches in each range may be coupled to the output of the second op amp 420.1 or 420.2 belonging to that range and the NMOS sense switches in each range may be coupled to the inverting input terminal of the op amp 420.1 or 420.2 belonging to that range.

The use of multiple ranges within the DAC 400 permits circuit designers to reset transistor resistances in each range. As illustrated in FIG. 4, each range may have at least one cell 430.1 (range 1), 430.5 (range 2) with PMOS and NMOS sense switches set to base resistances $R_{ps}$ and $R_{ns}$. Within each range, cells 430.4-430.5 and 430.7-430.8 that are part of a binary weighting architecture may have sense switches with resistances set in accordance with their relative weights. The use of ranges within the DAC 400 may be convenient for designers of high bit width DACs, for example 16-20 bit DACs. Without use of ranges, sense switch resistances would vary from a base resistance R to $(2^{16}-1)*R$ (32768*R) or $(2^{20}-1)*R$ (524,288*R). Thus, the use of ranges can simplify provision of the force switches within a DAC.

As indicated, each range may include a plurality of cells each including two force/sense switch pairs of complementary type. With each range, the cells may be integrated as a binary weighted DAC or in a hybrid configuration that blends the architecture of the evenly weighted segmented DAC and the binary weighted DAC. Thus, range 1 is illustrated as having a first set of evenly weighted cells 430.1-430.3 (shown as cells 0-3) and a second set of cells 430.4-430.5 are provided in a binary weighted configuration (cells 4 through K). Range 2 is illustrated as being provided in a pure binary weighted configuration.

The number of bits in the most significant range may be made large enough so that an op amp offset voltage for the op amps used in the lower range(s) is attenuated by a large enough amount that the offset of the op amps in lower ranges cause negligible INL error. For example, if there are 9 bits in the upper range, the op amp offset voltage of the op amp used in next highest range will contribute to INL error in the output, but this error will be attenuated by $2^9$ (divide by 512). Using this technique, smaller, cheaper, lower precision op amps may be used in ranges corresponding to lower significant bits of an input digital code. There is a small sensitivity of INL error to the number of bits in the upper range, in that the INL error can increase slightly as more bits are added to this range. Trading this off against the op amp offset contribution to INL it has been found in one embodiment that 9 bits in the upper range is a good compromise.

Due to the area consumed by the segmented DAC architectures, it may be advantageous to allocate a relatively small number of cells to the segmented configuration and the remaining cells to the binary weighted architecture. The segmented configuration may correspond to a relatively small number of bit positions of the input digital word (say the first 3 bits starting from the most significant bit position). Such a configuration provides an appropriate balance between precision in operation and conservation of area when the DAC is manufactured as an integrated circuit.

Although the FIG. 4 configuration may vary as compared to the FIGS. 1-3 embodiments, the general theory of operation is similar. Activated cells 430.1-430.N each contributes to the voltage at the output terminal OUT according to their weight. Consider range 1, for example. For those cells for which the PMOS force switch is closed (for example, cells 430.1 and 430.5), the associated sense switches $R_{ps}$, $4*R_{ps}$ also close, which couple the nodes at the head ends of the cell resistors 2R to the inverting input of op amp 410. The voltage at the inverting input of the op amp 410 is a weighted average of the voltages present at the head ends of the associated resistors 2R. The op amp 410.1 generates an output voltage necessary to balance the voltages at its two input terminals (bring them to $V_{HI}$). Thus, the op amp 410.1 generates an output voltage that overcomes the voltage losses that are induced by the force switches $R_{pf}$ of the activated cells 430.1, 430.5. Similarly, the closed PMOS force switches and sense switches in the second range present a voltage at the inverting input of op amp 410.2 that is a weighted average of the voltages present at the head ends of the resistors associated with the closed PMOS switches. Op amp 410.2 generates an output voltage necessary to balance the voltages at its two input terminals (bring them to $V_{HI}$), which cancels voltage losses across the closed PMOS force switches.

Similarly, for those cells for which the NMOS force switch is closed (for example, cells 430.2-430.4), the associated sense switches $R_{ns}$ also close, which couple the nodes at the head ends of the cell resistors 2R to the inverting input of op amp 420. The voltage at the inverting input of the op amp 420 is a weighted average of the voltages present at the head ends of the resistors associated with the closed NMOS force switches. The op amp 420 may generate an output voltage necessary to balance the voltages at its two input terminals (bring them to VA. Thus, the op amp 420 generates an output voltage that overcomes the voltage losses that are induced by the closed NMOS force switches. Similarly, the closed NMOS force switches and sense switches in the second range present a voltage at the inverting input of op amp 420.2 that is a weighted average of the voltages present at the head end of the resistors associated with the closed NMOS switches. Op amp 420.2 generates an output voltage necessary to balance the voltages at its two input terminals (bring them to $V_{LO}$), which cancels voltage losses across the closed NMOS force switches. As described above, this configuration improves the accuracy of the DAC 400.

As discussed the foregoing architectures mitigate many problems associated with voltage losses due to switch resistance and device mismatch. However in a preferred embodiment, other practical steps can be beneficial:

In the cells corresponding to the Most Significant Bits (the resistors and switches with the most weight), the size of the force switches may be made a few times greater than the size of the sense switches. For a given total area of switches, this reduces the overall INL error and reduces sensitivity to the parasitic resistance of routing between switches, resistors and op amps.

At extreme DAC digital codes within any range, all switches of one type (say, PMOS switches) will be active and no switches of the other type will be active. A DAC may include circuitry to detect this condition and close an additional switch between the force and sense connections to the inactive op amp. Doing so completes a feedback loop to the inactive op amp and prevents that op amp saturating when unused, which could introduce recovery latency when the system transitions to another, less extreme code.

A small capacitor may be added between the force and sense connections to each op amp. The capacitor may improve transient performance when there are few switches connected to one op amp and the resistance through the small number of switches is therefore large.

A backgate connection to each of the switches may be chosen so that there is a slight negative voltage across the silicon PN junction from the Source/Drain to the backgate. This reduces the leakage error, particularly at high temperature when the voltage drop across the force switches could otherwise slightly forward bias this PN junction.

Op amps may be chosen that have low input bias current (Ib). This input bias current is a new source of INL error with the foregoing DAC architectures, but this source can be made negligible using an op amp with a MOS input. Alternatively a bipolar input op amp that has been designed to minimize Ib makes this error negligible.

The foregoing embodiments have illustrated cells two pairs of force/sense switches of complementary type—one pair of PMOS devices and a second pair of NMOS devices. This configuration is likely to be advantageous in operation because the complementary devices naturally have different conducting properties in response to a common control signal. PMOS devices generally are advantageous to conduct signals at high voltages with respect to their control signals NMOS devices generally are advantageous to conduct signals at low voltages with respect to their control signals. The principles of the present invention are not so limited. It is possible to provide two pairs of force/sense switches of common device type, for example, both pairs as PMOS or as NMOS devices. In such an embodiment, to provide complementary operation, one force/switch pair may be connected to the control signals via an inverter.

Several embodiments of the present invention are specifically illustrated and described herein. However, it will be appreciated that modifications and variations of the present invention are covered by the above teachings and within the purview of the appended claims without departing from the spirit and intended scope of the invention.

I claim:

1. A digital to analog converter (DAC), comprising:
a pair of operational amplifiers, each having a first input to couple to a respective source voltage; and
a plurality of switch-controlled cells, each cell comprising:
a resistor,
a first force/sense pair of switches coupled to each other in series and rendered conductive in response to a first state of a control signal, an intermediate node of the first pair of switches coupled to the resistor, a force switch of the first pair coupled to an output of the first amplifier, and a sense switch of the first pair coupled to a second input of the first operational amplifier, and
a second force/sense pair of switches coupled to each other in series and rendered conductive in response to a second state of a control signal, an intermediate node of the second pair of switches coupled to the intermediate node of the first pair of switches, a force switch of the second pair coupled to an output of the second amplifier, and a sense switch of the second pair coupled to a second input of the second operational amplifier.

2. The DAC of claim 1, wherein
the sense switches within the first pairs have conductive resistances that scale in accordance with a weight with which the sense switches' cell contributes, when activated, to an output voltage of the DAC, and
the sense switches within the second pairs have conductive resistances that scale in accordance with a weight with which the sense switches' cell contributes, when activated, to the output voltage of the DAC.

3. The DAC of claim 1, wherein in operation multiple first force/sense pairs can be switched to the first operational amplifier and multiple second force/sense pairs can be switched to the second operational amplifier simultaneously.

4. The DAC of claim 1, wherein the DAC has a segmented architecture.

5. The DAC of claim 4, wherein resistances of the resistors of all the cells are equal to each other.

6. The DAC of claim 4, wherein resistances of the sense switches of the first pairs are equal to the resistances of the first force switches and resistances of all the sense switches of the second pairs are equal to the resistances of the second force switches.

7. The DAC of claim 1, wherein the DAC has a binary weighted R2R architecture.

8. The DAC of claim 1, wherein
resistances of the sense switches of the first pairs escalate according to a binary weighting of the switches' cell assignments, and
resistances of the sense switches of the second pairs escalate according to the binary weighting of the switches' cell assignments.

9. The DAC of claim 8, wherein resistances of the resistors of all the cells escalate according to a binary weighting of the resistors' cell assignments.

10. The DAC of claim 1, wherein the DAC has an architecture that is a hybrid of a binary weighted R2R architecture and a segmented architecture.

11. The DAC of claim 1, wherein the first pairs of switches are PMOS transistors and the second pairs of switches are NMOS transistors.

12. The DAC of claim 1, further comprising:
a second pair of op amps, each having a first input coupled to an input of a respective one of the first pair of op amps,
a second plurality of switch-controlled cells, each cell comprising:
a resistor,
a first force/sense pair of switches coupled to each other in series and rendered conductive in response to a first state of a control signal, an intermediate node of the first pair of switches coupled to the resistor, a force switch of the first pair coupled to an output of a first one of the second pair of op amps, and a sense switch of the first pair coupled to a second input of the first one of the second pair of op amps, and
a second force/sense pair of switches coupled to each other in series and rendered conductive in response to a second state of a control signal, an intermediate node of the second pair of switches coupled to the intermediate node of the first pair of switches, a force switch of the second pair coupled to an output of a second one of the second pair of op amps, and a sense switch of the second pair coupled to a second input of the second one of the second pair of op amps.

13. The DAC of claim 12, wherein
the first pair and second pair of op amps define respective ranges,
resistances of select first sense switches of the cells in each range escalate according to a binary weight corresponding to the cell's contribution, when activated, to an output voltage of the DAC, and
resistances of select second sense switches in each range escalate according to a binary weight corresponding to the cell's contribution, when activated, to an output voltage of the DAC.

14. A digital to analog converter (DAC), comprising:
plural pairs of op amps, each pair defining a respective range of the DAC;
a plurality of switch controlled cells for each range, each cell comprising:
a resistor,
a first force/sense pair of switches coupled to each other in series and rendered conductive in response to a first state of a respective control signal, an intermediate node of the first pair of switches coupled to the resistor, a force switch of the first pair coupled to an output of the first op amp in the respective range, and a sense switch of the first pair coupled to a second input of the first op amp in the respective range, and
a second force/sense pair of switches coupled to each other in series and rendered conductive in response to a second state of a control signal, an intermediate node of the second pair of switches coupled to the intermediate node of the first pair of switches, a force switch of the second pair coupled to an output of the second op amp in the respective range, and a sense switch of the second pair coupled to a second input of the second op amp in the respective range.

15. The DAC of claim 14, wherein across all cells of at least one of the ranges:
resistances of the first sense switches escalate according to a binary weight corresponding to the cell's respective contribution, when activated, to an output voltage of the DAC, and
resistances of the second sense switches escalate according to the binary weight corresponding to the cell's respective contribution, when activated, to the output voltage of the DAC.

16. The DAC of claim 14, wherein across select cells of at least one of the ranges:
resistances of the first sense switches escalate according to a binary weight corresponding to the cell's respective contribution, when activated, to an output voltage of the DAC, and
resistances of the second sense switches escalate according to the binary weight corresponding to the cell's respective contribution, when activated, to the output voltage of the DAC.

17. The DAC of claim 15, wherein a base resistance of the first sense switches and a base resistance of the second sense switches reset in each range.

* * * * *

UNITED STATES PATENT AND TRADEMARK OFFICE
CERTIFICATE OF CORRECTION

| | | |
|---|---|---|
| PATENT NO. | : 7,884,747 B2 | Page 1 of 2 |
| APPLICATION NO. | : 12/483295 | |
| DATED | : February 8, 2011 | |
| INVENTOR(S) | : McLachlan | |

It is certified that error appears in the above-identified patent and that said Letters Patent is hereby corrected as shown below:

On the Title page, item (57)

In the abstract, line 14, change "multiple a feedback paths" to --multiple feedback paths--

In the abstract, line 15, change "which permits the op amp" to --which permit the op amp--

In the abstract, line 16, change "voltages that overcomes" to --voltages that overcome--

In the abstract, line 17, change "losses induces by" to --losses induced by--

In the abstract, line 17, change "and cancels the" to --and cancel the--

In the Specification

In column 1, line 58, change "compared smaller" to --compared with smaller--

In column 2, line 57, change "$R_{ps}$ and $R_{ns}$ resistances" to --$R_{ps}$ resistance--

In column 3, line 31, change "applied cell" to --applied in cell--

In column 5, line 1, change "$2^{hu\ N-1}*R$" to --$2^{N-1}*R$--

In column 5, line 24, change "applied cell" to --applied in cell--

In column 5, line 52, change "switches and" to --switches $R_{ps}$ and--

In column 6, line 54, change "applied cell" to --applied in cell--

Signed and Sealed this
Twenty-ninth Day of September, 2015

Michelle K. Lee
*Director of the United States Patent and Trademark Office*

CERTIFICATE OF CORRECTION (continued)
U.S. Pat. No. 7,884,747 B2

In column 6, line 63, change "whichever one the two" to --whichever one of the two--

In column 6, line 63, change "force switches has been closed" to --force switches that has been closed--

In column 9, line 37, change "(bring them to VA." to --(bring them to $V_{LO}$).--